United States Patent [19]

Zenke

[11] Patent Number: 5,851,581
[45] Date of Patent: Dec. 22, 1998

[54] SEMICONDUCTOR DEVICE FABRICATION METHOD FOR PREVENTING TUNGSTEN FROM REMOVING

[75] Inventor: Masanobu Zenke, Tokyo, Japan

[73] Assignee: NEC Corporation, Tokyo, Japan

[21] Appl. No.: 899,722

[22] Filed: Jul. 24, 1997

Related U.S. Application Data

[63] Continuation of Ser. No. 426,136, Apr. 21, 1995, abandoned.

[30] Foreign Application Priority Data

Apr. 22, 1994 [JP] Japan ................... 6-084236

[51] Int. Cl.⁶ .................................................. B05D 5/12
[52] U.S. Cl. ........................... 427/97; 427/99; 427/124; 438/656; 438/913
[58] Field of Search .................. 427/97, 99, 124, 427/126; 438/491, 653, 654, 656, 913

[56] References Cited

U.S. PATENT DOCUMENTS

| | | | |
|---|---|---|---|
| 4,357,179 | 11/1982 | Adams et al. | 427/99 |
| 4,585,515 | 4/1986 | Maa | 156/643 |
| 4,604,274 | 8/1986 | Zavelovich et al. | 204/157.41 |
| 4,650,696 | 3/1987 | Raby | 427/99 |
| 4,898,841 | 2/1990 | Ho | 437/200 |
| 4,950,373 | 8/1990 | Sundermeyer et al. | 204/164 |
| 5,064,779 | 11/1991 | Hasegawa | 437/109 |
| 5,227,191 | 7/1993 | Nagashima | 427/99 |
| 5,429,991 | 7/1995 | Iwasaki et al. | 427/255.1 |

FOREIGN PATENT DOCUMENTS

| | | |
|---|---|---|
| 237441 | 6/1988 | Japan . |
| 237443 | 6/1988 | Japan . |
| 288824 | 7/1992 | Japan . |
| 4-288824 | 10/1992 | Japan . |

OTHER PUBLICATIONS

Morosanu, "Thin Films by Chemical Vapor Deposition," Thin Films Science and Technology, 1990, pp. 48–49.

Schuegraf, "Low Pressure Chemical Vapor Deposition;" Handbook of Thin–Film Deposition Processes and Techniques, 1988, pp. 80–81.

Primary Examiner—Brian K. Talbot
Attorney, Agent, or Firm—Young & Thompson

[57] ABSTRACT

A contact is formed in an insulating film covering on a silicon substrate and thereafter an amorphous silicon film is deposited thereon at 400° to 500° C. by using disilane. A tungsten film is then formed and etched back to form a tungsten plug through etch-back.

12 Claims, 5 Drawing Sheets

SEMICONDUCTOR DEVICE FABRICATION METHOD FOR PREVENTING TUNGSTEN FROM REMOVING

This application is a continuation of application Ser. No. 08/426,136, filed Apr. 21, 1995, now abandoned.

BACKGROUND OF THE INVENTION

The present invention relates to a method for fabricating a semiconductor device and, more particularly, to a method for fabricating such a semiconductor device that has a tungsten plug filling a contact hole and/or a via-hole.

In accordance with fine pattern of a contact hole and a via-hole, i.e., the increase in aspect ratio of those holes, it has been becoming difficult to fill the holes with an aluminum wiring layer. Therefore, such a technique has been proposed and put into practical use that fills the holes with a tungsten plug.

However, the tungsten plug has a poor adhesiveness with an insulating film in which the holes are formed, and hence it is necessary to form an adhesive layer such as a titanium nitride (expressed as Ti—N or TiNx) between the tungsten plug and the insulating film. However, because the Ti—N film is generally formed by the sputtering method, it is not formed with a uniform thickness. In particular, the Ti—N film is deposited thin on the inside surface of the hole having a high aspect ratio. For this reason, if a tungsten plug is directly formed on the above adhesive layer, a void is often formed in the tungsten plug. In the worst case, the tungsten plug is removed from the hole.

To solve the above problem, therefore, it is proposed in the Japanese Patent Laid-Open No. Hei 4-288824 to form a silicon film having a high step coverage before forming a blanket tungsten film. This method is described below by referring to FIGS. 6(a) to 6(d).

As shown in FIG. 6(a), a BPSG film 13 is first formed on a silicon substrate 1 and a contact hole is formed on the BPSG film 13. Then, a Ti film is deposited on the whole surface of the film 13 by the sputtering process and then selectively removed except a portion 14 thereof corresponding to the contact hole and vicinity thereof. Thereafter, an $SiO_2$ film 3 is formed as a inter-layer insulating film by the CVD process, followed by being patterned to form a contact hole 50.

Then, an amorphous silicon (a-Si) film 5 is formed on the whole surface by the plasma CVD process using $SiH_4$ up to a thickness of 50 to 100 nm (FIG. 6(b)). The part of the Ti film 14 contacting the silicon substrate 1 is then transformed into a Ti—Si (titanium silicide) film (not shown) through annealing in an atmosphere of N2 or the like and thereafter a tungsten blanket layer 6 is formed on the whole surface of the film 5 by the CVD process (FIG. 6(c)). The tungsten film 6 is then etched back to form a tungsten plug 7, as shown in FIG. 6(d).

The amorphous silicon film 5 is formed by the plasma CVD process has a good step coverage and thus prevents the tungsten plug 7 from being removed. Moreover, because the amorphous silicon film 5 is formed at a low temperature of 250° to 475° C., the method can preferably be applied to a multilayer wiring structure including aluminum-based wiring.

The amorphous silicon film 5 may be replaced with a polysilicon film formed by the low-pressure CVD (LP-CVD) method using $SiH_4$ gas. The polysilicon film thus formed has a better, conformality or step coverage than the amorphous silicon film. However, because the formation of a polysilicon film by the LP-CVD process uses approx. 600° C. (e.g. 630° C. in the case of the above Japanese Patent Laid-Open No. Hei 4-288824), a hillock of bottom-layer wiring is easily induced so that it is difficult to apply the LP-CVD process to a through-hole (via-hole) between wiring layers in a multilayer wiring structure. Moreover, because the temperature for depositing the tungsten film is different from that for depositing the polysilicon film, the respective temperature controls are required to cause the throughput to be lowered.

As described above, both an amorphous silicon film formed by the plasma CVD process and a polysilicon film formed by the LP-CVD process have advantages and disadvantages as an adhesive layer between an insulating film and a tungsten film. That is, the amorphous silicon film has an advantage that it can be formed by the plasma CVD process at a temperature almost equal to the tungsten-film formed temperature but it has a disadvantage that the conformality is inferior to that of a polysilicon film formed by the LP-CVD process. On the contrary, a polysilicon film formed by the LP-CVD process has an advantage that the conformality is superior to that of an amorphous silicon film formed by the plasma CVD process but it has disadvantages that the film forming temperature is greatly different from the tungsten-film forming temperature and the throughput is low.

SUMMARY OF THE INVENTION

Therefore, it is an object of the present invention to provide an improved method for forming a tungsten plug.

It is another object of the present invention to provide a method for preventing particles from being produced due to the removal of a tungsten film without decreasing the throughput.

A method according to the present invention is characterized by including the steps of depositing an amorphous silicon film on an insulating film by the LP-CVD process using the thermal decomposition of a disilane gas and depositing a tungsten film by the CVD process on the amorphus silicon film.

That is, the present invention is based upon the inventor's discovery that the amorphous silicon film formed by the LP-CVD process has a better step coverage than an amorphous silicon film formed by the plasma CVD process. Moreover, the inventor has found that by using disilane gas as a source gas for an amorphous silicon film, the deposition rate is improved compared to the case of using a silane gas and the amorphous silicon film can be formed at a temperature of 400° to 500° C. which is almost the same as the tungsten film forming temperature.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Referring now to FIG. 1, the description will be made below on a method according to the first embodiment of the present invention.

Figure 1A:
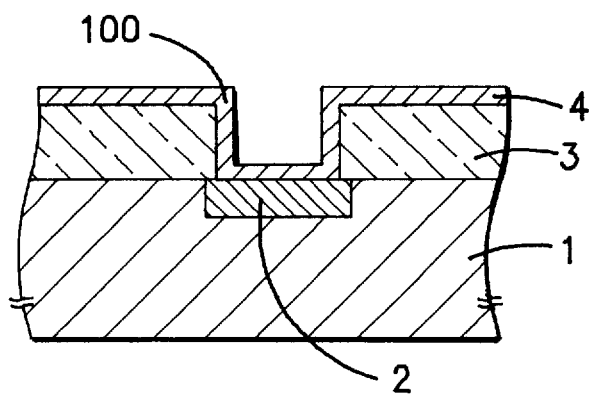
FIGS. 1(a), 1(b), 1(c), 1(d), 1(e) are sectional views illustrative of respective steps of a method according to a first embodiment of the present invention.

First, as shown in FIG. 1(a), an N-type diffusion layer 2 is selectively formed in a P-type silicon substrate 1, followed by depositing a silicon oxide film 3 with a thickness of approx. 500 nm as an insulating film by the CVD process. Then, a contact hole 100 is selectively formed in the oxide film 3 to expose a part of the N-type diffusion layer 2. Thereafter, a titanium film with a thickness of approx. 50 nm and a titanium nitride film with a thickness of approx. 100 nm are formed in that order by the sputtering process to form an adhesive layer 4. By the heat treatment, the titanium film in the layer 4 reacts with silicon of the region 2 to thereby form titanium silicide (not shown) at the interface between the layer 4 and the region 2 to decrease the contact resistance therebetween. The titanium nitride film (formed by the reactive sputtering of titanium, TiNx, 0<x<2, e.g. x=1.5) in the layer 4 serves as a barrier film for preventing tungsten, which will be deposited later, from penetrating the tungsten film.

Figure 3:
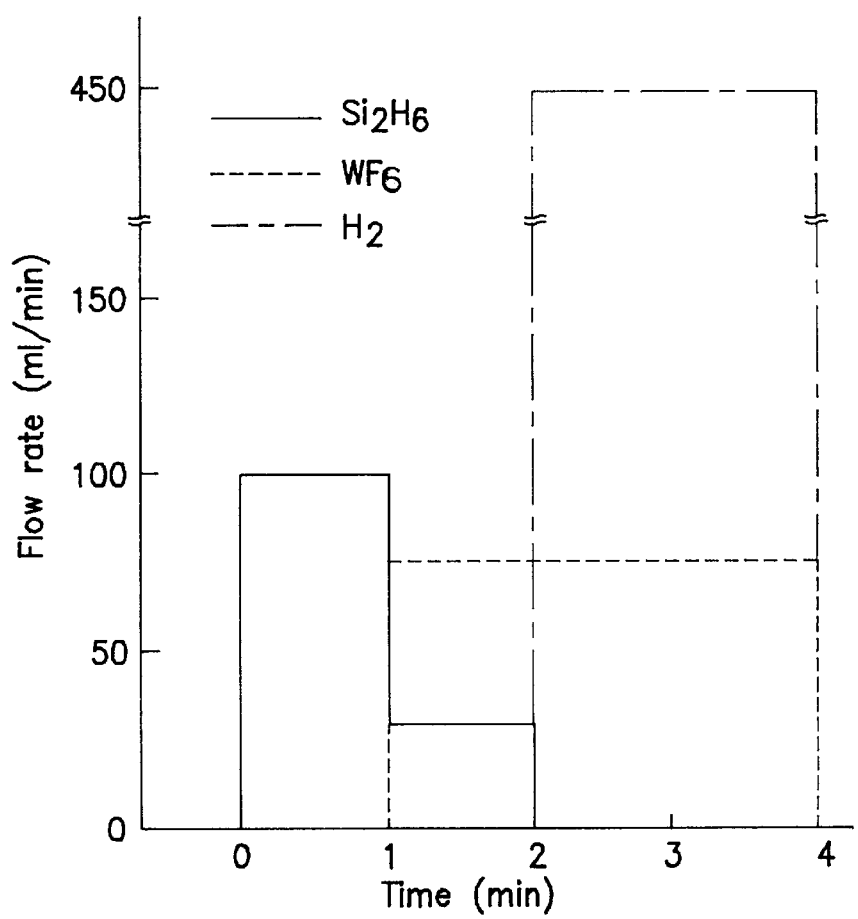
FIG. 3 is a graph showing a temporal change of a flow rate of a source gas used for the first embodiment.
Figure 4:
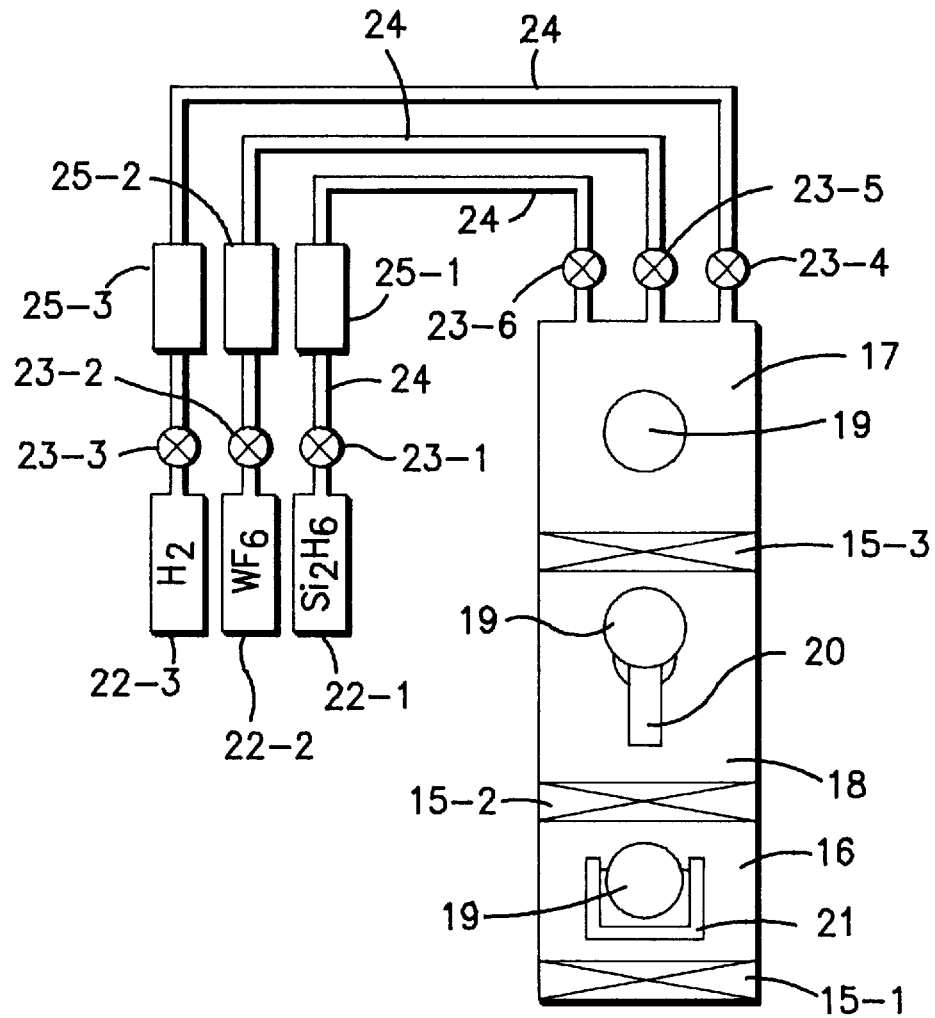
FIG. 4 is a typical view of a CVD system used for the present invention.
Figure 5A:
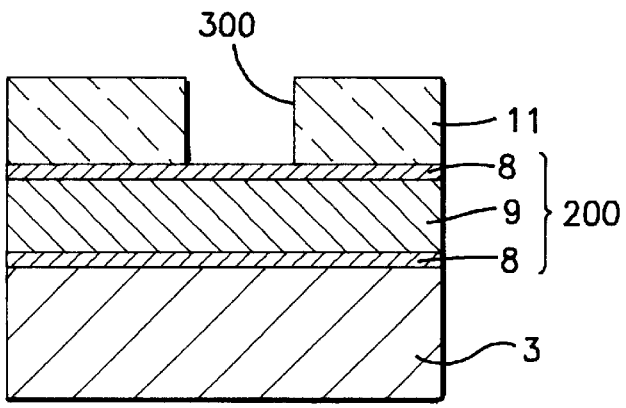
FIGS. 5(a), 5(b), 5(c) and 5(d) are sectional views illustrative of respective steps of a method according to a third embodiment of the present invention.
Figure 5B:
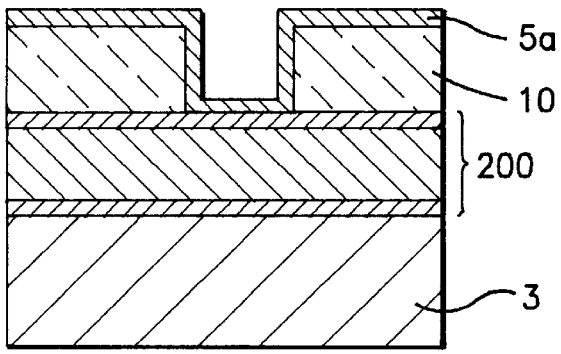
Figure 5C:
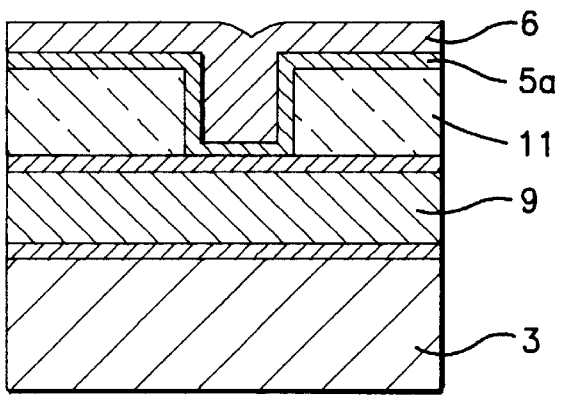
Figure 5D:
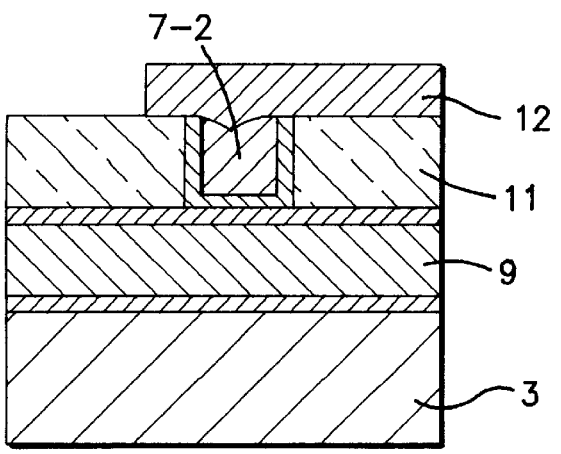
Figure 6A:
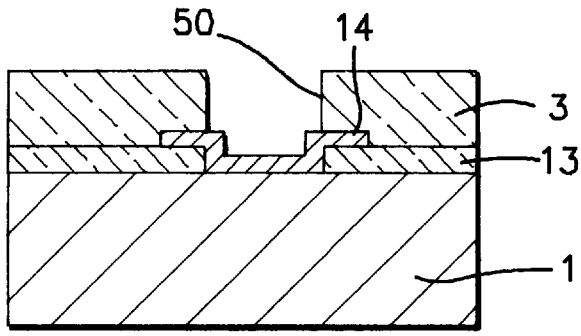
FIGS. 6(a), 6(b), 6(c) and 6(d) are sectional views illustrative of respective steps of a method according to the prior art.
Figure 6B:
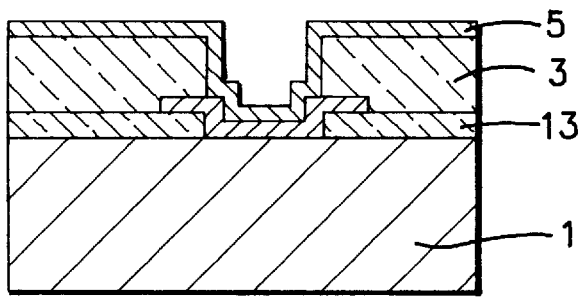
Figure 6C:
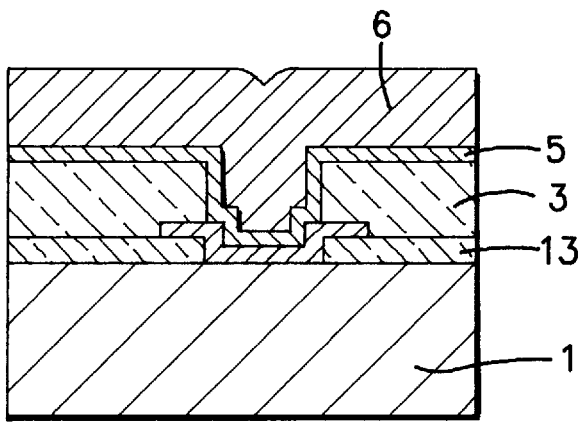
Figure 6D:
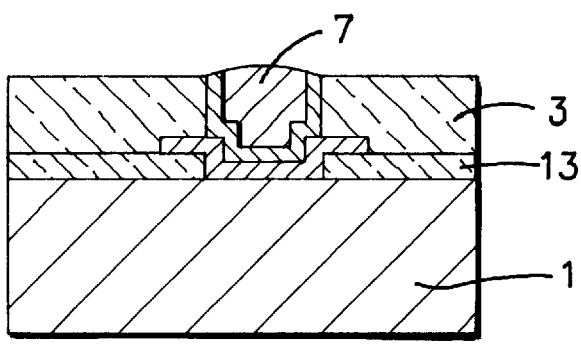

A semiconductor wafer thus prepared is transferred to a CVD system as shown in FIG. 4. In this drawing, the wafer is denoted by the reference numeral 19. Specifically, the wafer 19 set on a cassette 21 is loaded into a load-lock chamber 16 by opening a gate valve 15-1. This CVD system includes feed sources 22-1 to 22-3 for source gases $Si_2H_6$, $WF_6$, and $H_2$, respectively, flowmeters 25-1 to 25-3 having a flow-rate adjusting function, and pipes 24. The gate valve 15-1 is then closed and the load-lock chamber 16 is exhausted by a vacuum pump (not shown). A transfer chamber 18 and a CVD chamber 17 are also exhausted. When the respective chambers 16-18 are brought into a vacuum state, the gate valves 15-2 and 15-3 are opened to move the wafer 19 from the load-lock chamber 16 to the CVD chamber 17 through the chamber 18 by a transfer robot 20. After the gate valves 15-2 and 15-3 are closed, the wafer 19 in the CVD chamber 17 is heated. The wafer 19 can be heated by either resistance heating method or lamp heating method. When the temperature reaches a value between 400° and 500° C., valves 23-1 and 23-6 are opened so that only the disilane gas ($Si_2H_6$) is introduced into the CVD chamber 17. The flow rate of $Si_2H_6$ gas is in the range of 50 to 500 ml/min, and, in this embodiment, set to 100 ml/min, as shown in FIG. 3. The pressure of the CVD chamber 17 is set to 133 to 1,330 Pa. Under those conditions, the disilane gas is supplied for 1 minute, as also shown in FIG. 3.

Figure 1B:
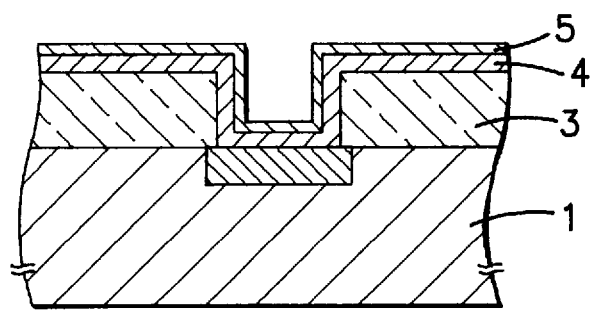

Thus, an amorphous silicon film 5 is deposited on the layer 4 with a thickness of 5 to 20 nm, as shown in FIG. 1(b). The amorphous silicon film 5 thus formed has a good step coverage and thus deposits uniformly even on the titanium nitride film in the contact hole 100. Moreover, the silicon film 5 can be formed at a magnitude order larger deposition rate compared to the case of using $SiH_4$ gas.

Turning back to FIG. 4, the valves 23-2 and 23-5 are then opened to introduce the $WF_6$ gas into the CVD chamber 17. At the same time, the valves 23-1 and 23-6 are adjusted to decrease the flow rate of $Si_2H_6$ gas such that the flow rate ratio between $Si_2H_6$ and $WF_6$ becomes 1:2. The disilane reduction process is thus carried out. It is preferable in this process that the flow rate of the $Si_2H_6$ gas is set to 5 to 100 ml/min and the flow rate of the $WF_6$ gas is set to 10 to 200 ml/min. In this embodiment, the flow rates of $Si_2H_6$ and $WF_6$ are 40 and 80 ml/min, respectively, (see FIG. 4). The pressure of the CVD chamber 17 is set to 66 to 1,330 Pa and the temperature of it is set to 400° to 500° C. By this step, tungsten is deposited on the amorphous silicon film 5 to form a core or nuclei for growing a tungsten layer thereon.

In place of using the disilane reduction, the silicon reduction may be employed. In this case only the $WF_6$ gas is supplied and the $Si_2H_6$ gas is stopped being supplied. In the silicon reduction, the amorphous silicon film 5 is slightly etched to attain the silicon reduction.

Then, the valves 23-1 and 23-6 are closed to stop feeding $Si_2H_6$ and the valves 23-3 and 23-4 are in turn opened to introduce the $H_2$ gas. The flow rate of $H_2$ gas is set to a value 4 to 10 times as large as the flow rate of $WF_6$ gas. That is, the flow rate of $H_2$ gas is set to 300 to 1,000 ml/min, the flow rate of $WF_6$ is set to 10 to 200 ml/min. In this embodiment, the flow rates of $WF_6$ and $H_2$ are 80 and 450 ml/min, respectively (see FIG. 4). The pressure is set to 1,330 to 13,300 Pa, and the temperature is set to 400° to 500° C.

Figure 1C:
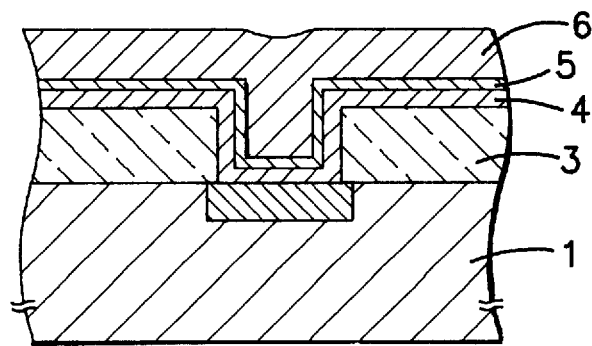

Thus, as shown in FIG. 1(c), a tungsten film 6 with a thickness of 300 to 800 nm is formed with completely filling the contact hole.

Then, the valves 23-2, 23-3, 23-4, and 23-5 are closed, heating of the wafer is stopped. The gate valves 15-2 and 15-3 are then opened to move the wafer 19 to the load-lock chamber 16, the gate valves 15-2 and 15-3 being thereafter closed. The pressure of the load-lock chamber 16 is brought to the atmospheric pressure, and then the gate valve 15-1 is opened to take out the wafer cassette 21.

Figure 1D:
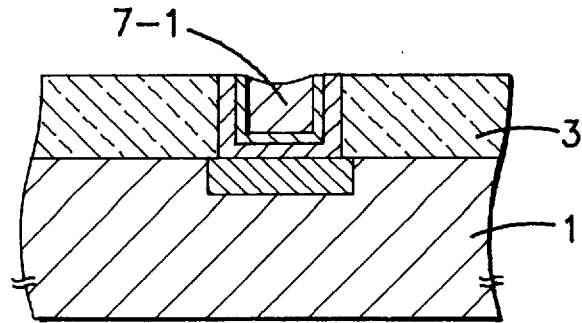
Figure 1E:
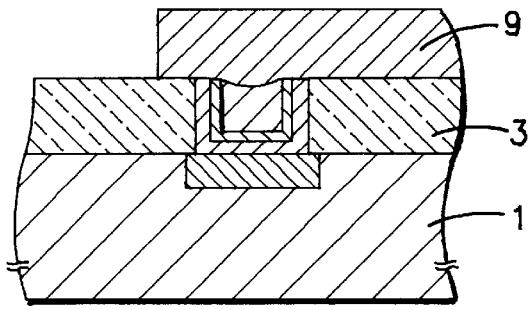

Then, the wafer 9 is transferred to an etching system (not illustrated) to etch the tungsten film 6 by a mixed gas of $SF_6$ and $O_2$. Thereby, as shown in FIG. 1(d), a tungsten plug 7-1 is formed. Then, an aluminum layer including silicon and/or copper is deposited and patterned to form a first-level aluminum wiring layer 9 in contact with the tungsten plug 7-1, as shown in FIG. 1(e). If desired, it may be possible to form a TiNx film before and after forming the aluminum film, so that a wiring layer of a three-layer structure made of a TiNx film, an Al—Si—Cu alloy film, and a TiNx film is obtained.

Figure 2:
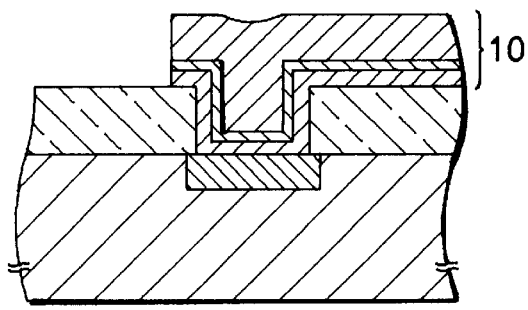
FIG. 2 is a sectional view illustrative of a semiconductor chip fabricated by a method according to a second embodiment of the present invention.

The tungsten layer 6 as shown in FIG. 1(c) may be employed as a first-level wiring. In this case, the tungsten film 6 is patterned to form a first-level wiring layer 10, as shown in FIG. 2 as a second embodiment of the present invention.

As described above, the tungsten plug 7-1 or film 6 is prevented from peeling off because the amorphous silicon film 5 formed through the thermal decomposition of disilane gas using the LP-CVD process has a very good conformality and a step coverage. Moreover, the thermal decomposition of disilane gas using the LP-CVD process is performed at 400° to 500° C. which is almost the same as the tungsten film forming temperature. Furthermore, the amorphous silicon film 5 and the tungsten film 6 are continuously formed in the same CVD chamber. The throughput is thereby improved.

Furthermore, the tungsten film 6 is formed at the first phase using the disilane reduction process or silicon reduction process and at the second phase using -the hydrogen reduction process. Therefore, tungsten serving as nuclei of growth is securely formed at the first phase and it can quickly be grown at the second phase. Therefore, the thick tungsten film 6 with a high adhesiveness can quickly be formed.

Referring to FIG. 5, in the second embodiment of the present invention, a first-level wiring layer 9 of a three-layer structure made of an aluminum alloy film 9 sandwiched by two titanium nitride films (TiNx) 8 is formed on the insulating film 3 covering the silicon substrate (200). A silicon oxide film 11 serving as an inter-layer insulating film is formed on the first-layer wiring 9 by the plasma CVD process. The thickness of the silicon oxide film 11 is set to approx. 500 nm. Then, the silicon oxide film 11 is selectively etched to form a via-hole 300 (FIG. 5(*a*)).

Then, an amorphous silicon film 5*a* used for an adhesive layer is formed up to a thickness of approx. 50 nm by using $Si_2H_6$ gas similarly to the case of the above embodiment (FIG. 5(*b*)). In this embodiment, because the layer 4 as shown in FIG. 1 is not employed, the film 5*a* is formed thicker than that of the first embodiment.

Then, similarly to the first embodiment, a tungsten film 6 with a thickness of 20 to 30 nm is formed by the silicon reduction method or disilane reduction method, as shown in FIG. 5(*c*).

The deposition of the tungsten film is also carried out by silane reduction method. In this method, it is necessary to set a $SiH_4$ feed source, a flowmeter, and a pipe to the CVD system shown in FIG. 4. The flow rate of $SiH_4$ gas is set to 5 to 100 ml/min, the flow rate of $WF_6$ gas is set to 10 to 200 ml/min, the pressure is set to 66 to 1,330 Pa, and the temperature is set to 400° to 500° C. Then, similarly to the first embodiment, the tungsten film with a thickness of 300 to 600 nm is formed by using a mixed gas of $WF_6$ and $H_2$ with filling the via-hole, similarly to FIG. 5(*c*).

Then, the tungsten film 6 is etched back to form a tungsten plug 7-2, as shown in FIG. 5(*d*), and thereafter an aluminum-base alloy film is deposited and patterned to form a second layer wiring 12. In this case, it is also possible to form a three-layer structure by forming a TiNx film before and after depositing the aluminum-base alloy film.

Moreover, it is possible to form a two-layer wiring made of a tungsten film and the amorphous silicon film 6 by patterning the films under the state in FIG. 5(*c*). Furthermore, similarly to the first embodiment, it is possible to form a via-hole, thereafter form a TiNx film by the sputtering process, and thereafter form an amorphous silicon film by $Si_2H_6$ gas, and then the tungsten film 6.

Thus, an amorphous film and a tungsten film can be formed at a temperature of 400° to 500° C. even when an aluminum-based alloy film is present as a bottom-layer wiring, it is possible to prevent a hillock from occurring.

It is possible to set a system for feeding carrier gas such as argon gas to the CVD system shown in FIG. 4 or form a plurality of CVD chambers in the system. Because this type of the CVD system can easily be realized by slightly remodeling a CVD system for forming a polysilicon film by $SiH_4$ or a CVD system for forming a blanket tungsten film, it is economical.

As described above, because the present invention formes an amorphous silicon film using $Si_2H_6$ before forming a tungsten film, the adhesiveness between the tungsten film and a base film is improved. Therefore, it is possible to prevent particles from being produced due to the removal of the tungsten film.

Moreover, because an amorphous silicon film and a tungsten film can be formed at 400° to 500° C., it is possible to form a tungsten plug which can be applied to both contact hole and via-hole. Furthermore, it is possible to form the wiring of any layer of a multilayer wiring. Furthermore, because an amorphous silicon film and a tungsten film an be formed at the same temperature or almost same temperature by the same CVD system, it is possible to decrease the time required to move a wafer or change the temperature. Therefore, the present invention is superior in the mass productivity.

Furthermore, as amorphous silicon film is formed by the LP-CVD process using thermal decomposition of $Si_2H_6$, the film has better conformality than a polysilicon film formed by the plasma CVD process. Therefore, the amorphous silicon film can be applied to a fine contact hole or via-hole. Moreover, because the thermal CVD process causes less damage than the plasma CVD process, there are advantages that less leak current occurs at a contact portion and the device reliability is improved.

What is claimed is:

1. A method for fabricating a semiconductor device comprising the steps of:

depositing an amorphous silicon film on a hole in an insulating film covering a semiconductor substrate by a low-pressure CVD process using a thermal decomposition of a disilane gas in a first chamber at a first temperature between 400° and 500° C.; and depositing a tungsten film on said amorphous silicon film by a CVD process in the first chamber at a second temperature;

said first temperature being substantially equal to said second temperature so that said amorphous silicon film and said tungsten film are continuously deposited in the same chamber wherein between depositing the amorphous silicon film and depositing the tungsten film, the step of decreasing without stopping an input flow of the disilane gas into the first camber and introducing a tungsten gas into the first chamber so that a flow rate between the disilane gas and the tungsten film depositing gas in about 1:2.

2. The method according to claim 1, wherein said hole being filled by said amorphous silicon film and said tungsten film.

3. The method according to claim 1, wherein said step of depositing said tungsten film comprises the steps of forming tungsten nuclei on said amorphous silicon film at said second temperature and growing said tungsten nuclei to form said tungsten film at said second temperature.

4. The method of claim 1, where the tungsten film depositing gas is tungsten fluoride.

5. A method for fabricating a semiconductor device comprising the steps of:

forming an insulating film on a semiconductor substrate;

selectively removing said insulating film to form a hole in said insulating film, said insulating film thereby having a side surface defining said hole and a top surface extending from said side surface;

depositing in a first chamber at a first temperature between 400° and 500° C. amorphous silicon film on said top surfaces and side surface of said insulating film by a thermal decomposition of disilane; and amorphous silicon film thereby having a portion surrounded by side surface of said insulated film;

forming tungsten nuclei on said amorphous silicon film in the first chamber at substantially the first temperature; and growing said tungsten nuclei at substantially the first temperature to fill said hole by tungsten film so that said amorphous silicon film and said tungsten nuclei are continuously deposited in the same chamber wherein between depositing the amorphous silicon film and depositing the tungsten nuclei, the step of decreasing without stopping an input flow of the disilane gas into the first chamber and introducing a tungsten nuclei depositing gas into the first chamber so that a flow rate ratio between the disilane gas the tungsten film nuclei depositing gas is about 1:2.

6. The method according to claim 5, wherein said semiconductor substrate includes an impurity diffusion layer and said hole exposes a part of said impurity diffusion layer.

7. The method according to claim 5, further comprising a conductive layer buried in said insulating film, said hole exposing a part of said conductive layer.

8. The method according to claim 5, wherein said step of forming said tungsten nuclei is performed by a disilane reduction process using disilane and tungsten fluoride.

9. The method according to claim 5, wherein said step of forming said tungsten nuclei is performed by a silicon reduction process using tungsten fluoride.

10. The method according to claim 5, wherein said step of growing said tungsten nuclei is performed by a hydrogen reduction process using tungsten fluoride and a hydrogen gas.

11. The method of claim 5, further comprising, between the steps of depositing the amorphous silicon film and depositing the tungsten nuclei, the steps of stopping an input flow of the disilane gas into the first chamber and immediately thereafter introducing a tungsten nuclei depositing gas into the first chamber.

12. The method of claim 5, wherein the tungsten film depositing gas is tungsten fluoride.

* * * * *